(12) United States Patent
Yamada et al.

(10) Patent No.: US 9,709,888 B2
(45) Date of Patent: Jul. 18, 2017

(54) PHOTOSENSITIVE RESIN COMPOSITION FOR CTP FLEXOGRAPHIC PRINTING ORIGINAL PLATE AND PRINTING ORIGINAL PLATE PREPARED THEREFROM

(71) Applicant: TOYOBO CO., LTD., Osaka-shi, Osaka (JP)

(72) Inventors: Hiroto Yamada, Okayama (JP); Yukimi Yawata, Okayama (JP); Kazuya Yoshimoto, Okayama (JP)

(73) Assignee: TOYOBO CO., LTD., Osaka (JP)

( * ) Notice: Subject to any disclaimer, the term of this patent is extended or adjusted under 35 U.S.C. 154(b) by 0 days.

(21) Appl. No.: 14/375,518

(22) PCT Filed: Mar. 22, 2013

(86) PCT No.: PCT/JP2013/058284
§ 371 (c)(1),
(2) Date: Jul. 30, 2014

(87) PCT Pub. No.: WO2013/146586
PCT Pub. Date: Oct. 3, 2013

(65) Prior Publication Data
US 2014/0370440 A1 Dec. 18, 2014

(30) Foreign Application Priority Data

Mar. 30, 2012 (JP) .................... 2012-080265
Jan. 31, 2013 (JP) .................... 2013-016562

(51) Int. Cl.
*G03F 7/00* (2006.01)
*G03F 7/033* (2006.01)
*G03F 7/027* (2006.01)
*B41N 1/12* (2006.01)
*G03F 7/24* (2006.01)

(52) U.S. Cl.
CPC ............ *G03F 7/033* (2013.01); *B41N 1/12* (2013.01); *G03F 7/027* (2013.01); *G03F 7/24* (2013.01)

(58) Field of Classification Search
CPC ........................................................ G03F 1/68
USPC ............................................. 430/270.1
See application file for complete search history.

(56) References Cited

U.S. PATENT DOCUMENTS

| 4,517,278 | A  | * | 5/1985 | Sakurai | G03F 7/033 430/286.1 |
|---|---|---|---|---|---|
| 6,197,479 | B1 | * | 3/2001 | Tanaka et al. | 430/281.1 |
| 2007/0117039 | A1 | * | 5/2007 | Wada et al. | 430/270.1 |
| 2010/0189960 | A1 | * | 7/2010 | Yoshida et al. | 428/156 |
| 2011/0023739 | A1 | * | 2/2011 | Yoshimoto et al. | 101/395 |
| 2011/0083571 | A1 | * | 4/2011 | Yawata | B41C 1/05 101/395 |

FOREIGN PATENT DOCUMENTS

| EP | 2295258 A1 |   | 3/2011 |   |
|---|---|---|---|---|
| EP | 2306245 A1 |   | 4/2011 |   |
| JP | 2001-356493 A |   | 12/2001 |   |
| JP | 2007-86152 A |   | 4/2007 |   |
| JP | 2007086152 A | * | 4/2007 |   |
| JP | 2008-250055 A |   | 10/2008 |   |
| JP | 2009-288700 A |   | 12/2009 |   |
| JP | EP 2295258 A1 | * | 3/2011 | .......... B41C 1/05 |
| JP | EP 2306245 A1 | * | 4/2011 | .......... G03F 7/202 |
| WO | 2008/156115 A1 |   | 12/2008 |   |
| WO | 2009/141930 A1 |   | 11/2009 |   |

OTHER PUBLICATIONS

International Search Report dated Jun. 4, 2013, issued in corresponding application No. PCT/JP2013/058284.
Extended European Search Report dated Nov. 13, 2015 issued in counterpart European patent application No. 13769719.9, (6 pages).

* cited by examiner

*Primary Examiner* — Chanceity Robinson
(74) *Attorney, Agent, or Firm* — Westerman, Hattori, Daniels & Adrian, LLP

(57) ABSTRACT

A photosensitive resin composition for CTP flexographic printing original plate containing at least a hydrophobic polymer obtained from water-dispersible latex (A), a hydrophilic polymer (B), a photopolymerizable unsaturated compound (C), a photopolymerization initiator (D), and if necessary, rubber (E), characterized in that, the photopolymerizable unsaturated compound (C) comprises a photopolymerizable oligomer containing no hydroxyl group (C-1), a hydroxyl group-containing photopolymerizable monomer having a pentaerythritol skeleton, a dipentaerythritol skeleton or a glycerol skeleton (C-2) and, optionally, a photopolymerizable monomer containing no hydroxyl group (C-3). The content of the hydroxyl group-containing photopolymerizable monomer (C-2) is 1 to 20% by mass of the photosensitive resin composition. The content of the rubber (E) is preferably 0.5 to 15% by mass of the photosensitive resin composition.

12 Claims, No Drawings

PHOTOSENSITIVE RESIN COMPOSITION FOR CTP FLEXOGRAPHIC PRINTING ORIGINAL PLATE AND PRINTING ORIGINAL PLATE PREPARED THEREFROM

TECHNICAL FIELD OF THE INVENTION

The present invention relates to a photosensitive resin composition to be used for producing a flexographic printing plate according to a Computer to Plate Technique.

BACKGROUND ART

In recent years, in the field of flexographic printing, a CTP Technique, known as a digital image-forming technique, has been widely used as a general technique. The CTP technique is a method in which information processed on a computer is directly outputted onto a printing plate so that a concave/convex pattern to form a relief is obtained. This technique eliminates the necessity of negative film producing steps, thereby making it possible to reduce costs and time required for forming the negative film.

As to a CTP photosensitive flexographic printing original plate, there has been proposed a water-developable flexographic printing original plate having such a constitution that a protective layer (barrier layer) is formed on a photosensitive resin layer and a heat-sensitive mask layer is further formed thereon (Patent Document 1). Although the Patent Document 1 can provide a photosensitive flexographic printing original plate having an excellent laser ablation property, it results in a printing blur which is nothing wrong in a negative system. To begin with, the ablation layer formed for CTP is easily deformed as compared with a negative film. Therefore, there is a disadvantage that the shape of the relief top area is easily deformed. Accordingly, in the printing, uneven transfer of ink (printing blur) caused by bulging of the edge as such has been apt to be generated.

In addition, in the photosensitive resin composition of Patent Document 1 for the CTP photosensitive flexographic printing original plate, there are disadvantages that mechanical strength is insufficient and printing durability upon printing is insufficient and there has been a demand for improvements thereof.

As such, the conventional CTP flexographic printing original plate using a water-developable photosensitive resin composition does not satisfy the requirements for solving all of laser ablation property, water developing ability, printing durability and a printing blur as a result of changes in relief top shape.

PRIOR ART DOCUMENTS

Patent Documents

Patent Document 1: Japanese Patent No. 4332865

DISCLOSURE OF THE INVENTION

Problem that the Invention is to Solve

The present invention has been created in view of the current status of the conventional art as such. The object of the present invention is, in a CTP water-developable flexographic plate containing water-dispersible latex in a photosensitive resin composition, to provide a CTP photosensitive flexographic printing original plate of high performance which suppresses a printing blur due to bulging of a relief edge area (a problem specific in a CTP plate) and which further satisfies a printing durability while the conventional developing property and image-reproducing property are still maintained, and also to provide a photosensitive resin composition therefor.

Means for Solving the Problem

In order to achieve such an object, the present inventors have conducted intensive investigations and, as a result, they have found that the desired effects are achieved when a specific photopolymerizable monomer containing hydroxyl groups is used as a cross-linking component for a photosensitive resin layer whereupon the present invention has been accomplished.

Thus, the present invention comprises the following constitutions (1) to (5):

(1) A photosensitive resin composition for CTP flexographic printing original plate containing at least a hydrophobic polymer obtained from water-dispersible latex (A), a hydrophilic polymer (B), a photopolymerizable unsaturated compound (C) and a photopolymerization initiator (D), characterized in that, the photopolymerizable unsaturated compound (C) comprises a photopolymerizable oligomer containing no hydroxyl group (C-1), a hydroxyl group-containing photopolymerizable monomer having a weight-average molecular weight of 200 to 1500 and having a pentaerythritol skeleton, a dipentaerythritol skeleton or a glycerol skeleton (C-2) and, optionally, a photopolymerizable monomer containing no hydroxyl group (C-3), wherein the content of the hydroxyl group-containing photopolymerizable monomer (C-2) is 1 to 20% by mass of the photosensitive resin composition.

(2) The photosensitive resin composition for CTP flexographic printing original plate according to (1), wherein the composition further contains rubber (E) and the content of the rubber (E) is 0.5 to 15% by mass of the photosensitive resin composition.

(3) The photosensitive resin composition for CTP flexographic printing original plate according to (2), wherein the content of the rubber (E) is 1 to 7% by mass of the photosensitive resin composition.

(4) The photosensitive resin composition for CTP flexographic printing original plate according to any of (1) to (3), wherein concentration of the hydroxyl groups derived from the hydroxyl group-containing photopolymerizable monomer (C-2) is 0.1 to 1.5 equivalent mol/kg.

(5) A CTP flexographic printing original plate, characterized in that, a heat-sensitive mask layer is formed on a surface of a photosensitive resin layer comprising the photosensitive resin composition mentioned in any of (1) to (4).

Advantages of the Invention

The photopolymerizable unsaturated compound in the photosensitive resin composition of the present invention contains a specific hydroxyl group-containing photopolymerizable monomer. In addition, the photosensitive resin composition of the present invention uses rubber in a specific amount. Accordingly, it is now possible to provide a CTP photosensitive flexographic printing original plate exhibiting excellent cupping, release of a cover film, resistance of a heat-sensitive mask layer, mechanical strength/elongation and developing property.

BEST MODE FOR CARRYING OUT THE INVENTION

Hereinafter, the photosensitive resin composition for CTP flexographic printing original plate according to the present invention and a CTP flexographic printing original plate prepared therefrom will be illustrated.

The photosensitive resin composition for CTP flexographic printing original plate according to the present invention is characterized in that the composition contains at least a hydrophobic polymer obtained from water-dispersible latex (A), a hydrophilic polymer (B), a photopolymerizable unsaturated compound (C), a photopolymerization initiator (D) and, optionally, rubber (E) and particularly characterized in that a specific hydroxyl group-containing photopolymerizable monomer (C-2) is used as the photopolymerizable unsaturated compound (C) and that rubber is used in a specific amount.

Examples of the hydrophobic polymer obtained from water-dispersible latex (A) include: water-dispersible latex polymers, such as polybutadiene (BR) latex, natural rubber latex, styrene-butadiene copolymer latex, acrylonitrile-butadiene copolymer (NBR) latex, polychloroprene latex, polyisoprene latex, polyurethane latex, methylmethacrylate-butadiene copolymer latex, vinylpyridine polymer latex, butyl polymer latex, thiokol polymer latex and acrylate polymer latex; and polymers obtained by copolymerizing another component, such as acrylic acid and methacrylic acid, therewith. Among these, water-dispersible latex polymers having a butadiene skeleton or an isoprene skeleton in molecular chains are preferably used from the viewpoints of hardness and rubber elasticity. More specifically, polybutadiene latex, styrene-butadiene copolymer latex, acrylonitrile-butadiene copolymer latex, methylmethacrylate-butadiene copolymer latex and polyisoprene latex are preferably used. The latex needs to be designed so that its existence is confirmed as independent fine particles. Compounding amount of the component (A) in the photosensitive resin composition is preferred to be 40 to 80% by mass. When it is less than 40% by mass, strength as a printing plate may become insufficient while, when it is more than 80% by mass, water developing process may become time-consuming.

Hydrophilic polymers (B) preferably include polymers having a hydrophilic group such as —COOH, —COOM (M is a monovalent, divalent or trivalent metal ion or a substituted or unsubstituted ammonium ion), —OH, —NH$_2$, —SO$_3$H and a phosphate group, and specifically include a polymer of (meth)acrylic acid or salts thereof, a copolymer of (meth)acrylic acid or salts thereof with an alkyl (meth) acrylate, a copolymer of (meth)acrylic acid or salts thereof with styrene, a copolymer of (meth)acrylic acid or salts thereof with vinyl acetate, a copolymer of (meth)acrylic acid or salts thereof with acrylonitrile, polyvinyl alcohol, carboxymethylcellulose, polyacrylamide, hydroxyethylcellulose, polyethylene oxide, polyethyleneimine, polyurethane which has a —COOM group, polyurea urethane which has a —COOM group, polyamide acid which has a —COOM group, and salts or derivatives thereof. These may be used solely or two or more polymers may be used in combination. Compounding amount of the component (B) in the photosensitive resin composition is preferred to be 2 to 10% by mass. When it is less than 2% by mass, developing property may become bad while, when it is more than 10% by mass, resistance of the relief to water may become bad.

The photopolymerizable unsaturated compound (C) comprises a photopolymerizable oligomer containing no hydroxyl group (C-1), a photopolymerizable monomer containing hydroxyl groups (C-2) and, optionally, a photopolymerizable monomer containing no hydroxyl group (C-3). Compounding amount of the component (C) in the photosensitive resin composition is preferred to be 25 to 45% by mass. When it is less than 25% by mass, developing property may become bad while, when it is more than 45% by mass, toughness may become bad.

The photopolymerizable oligomer containing no hydroxyl group (C-1) is preferred to be a polymer having a number average molecular weight of 1,000 to 10,000 which has been obtained by binding an ethylenic unsaturated group to terminal and/or side chain of a conjugated diene-based polymer. The conjugated diene-based polymer which constitutes the conjugated diene-based ethylenic polymer is formed of a homopolymer of a conjugated diene unsaturated compound or a copolymer of a conjugated diene unsaturated compound and a monoethylenically unsaturated compound. Examples of such a copolymer include a butadiene polymer, an isoprene polymer, a chloroprene polymer, a styrene-chloroprene copolymer, an acrylonitrile-butadiene copolymer, an acrylonitrile-isoprene copolymer, a methyl methacrylate-isoprene copolymer, a methyl methacrylate-chloroprene copolymer, a methyl acrylate-butadiene copolymer, a methyl acrylate-isoprene copolymer, a methyl acrylate-chloroprene copolymer, an acrylonitrile-butadiene-styrene copolymer and an acrylonitrile-chloroprene-styrene copolymer. Among these, a butadiene polymer, an isoprene polymer and an acrylonitrile-butadiene copolymer are preferable, and a butadiene polymer and an isoprene polymer are particularly preferable from the viewpoint of rubber elasticity and photocurability. Compounding amount of the component (C-1) in the photosensitive resin composition is preferred to be 10 to 30% by mass. When it is less than 10% by mass, resistance of the relief to solvents may become bad while, when it is more than 30% by mass, tackiness of the resin increases whereby handling may become bad.

The hydroxyl group-containing photopolymerizable monomer (C-2) is an ethylenic polymerizable unsaturated hydrocarbon compound having at least one hydroxyl group in a molecule. In terms of the structure, it has at least one of pentaerythritol skeleton, dipentaerythritol skeleton and glycerol skeleton, and has the hydroxyl group(s) derived from the skeleton(s). Dihydric alcohol such as ethylene glycol or propylene glycol may be added to those skeletons. Concentration of hydroxyl groups derived from the hydroxyl group-containing photopolymerizable monomer in the photosensitive resin composition is preferred to be 0.01 to 5 equivalent mol/kg, more preferred to be 0.05 to 2 equivalent mol/kg, and further preferred to be 0.1 to 1.5 equivalent mol/kg. Weight-average molecular weight of the hydroxyl group-containing photopolymerizable monomer is 200 to 1500, preferably 200 to 1000, and more preferably 210 to 900. This component (C-2) has a role of preventing such a phenomenon that, upon main exposure to light, the photosensitive resin component is oozed out to surface layer of the photosensitive resin plate from a non-exposed area to an exposed area and swells and dissolves the tissues of the surface layer of the photosensitive resin plate such as heat-sensitive mask layer or protective layer so as to increase tackiness of the released portion.

Specific examples of the hydroxyl group-containing photopolymerizable monomer include pentaerythritol (poly) acrylate, ethoxylated pentaerythritol (poly)acrylate, propoxylated pentaerythritol (poly)acrylate, (poly)glycidyl ether pentaerythritol (poly)acrylate, dipentaerythritol (poly) acrylate, ethoxylated dipentaerythritol (poly)acrylate, propoxylated dipentaerythritol (poly) acrylate, polyglycidyl ether dipentaerythritol (poly)acrylate, glycidyl phthalate (poly)acrylate, polyglycidyl phthalate (poly)acrylate, glycidyl hexahydrophthalate (poly) acrylate, polyglycidyl hexahydrophthalate (poly)acrylate, glycidyl trimethylolpropane (poly)acrylate, polyglycidyl trimethylolpropane (poly) acrylate, glycidyl (di)acrylate, ethoxylated glycidyl (di)acrylate, propoxylated glycidyl (di)acrylate and polyglycidyl (poly)acrylate. Methacrylates corresponding to the above acrylates are also exemplified. Compounding amount of the component (C-2) in the photosensitive resin composition is 1 to 20% by mass and preferably 1.5 to 18% by mass. When the amount of the component (C-2) is less than the above range, a printing blur may happen while, when it is more than the above range, toughness of the relief may be deteriorated.

The photopolymerizable monomer (C-3) containing no hydroxyl group is an ethylenic polymerizable unsaturated hydrocarbon compound having no hydroxyl group in a molecule. In order to increase the cross-linking density of the printing plate surface, the component (C-3) may be added within such a range that the addition thereof does not inhibit the effect of the present invention. The photopolymerizable monomer containing no hydroxyl group is preferred to be such a compound having molecular weight of 100 to 500 and having at least two ethylenic unsaturated groups in terminals or side chains thereof. Specific examples thereof include ethylene glycol di(meth)acrylate, diethylene glycol di(meth)acrylate, 1,4-butanediol di(meth)acrylate, 1,6-hexanediol di(meth)acrylate, trimethylolpropane tri(meth)acrylate, glycerol di(meth)acrylate, triethylene glycol di(meth)acrylate, PEG #200 di(meth)acrylate, PEG #400 di(meth)acrylate, 1,3-butanediol dimethacrylate neopentyl glycol di(meth)acrylate, 1,10-decanediol dimethacrylate, di(meth)acrylate of an adduct of bisphenol A to ethylene oxide, ethylene oxide-modified trimethylolpropane triacrylate, pentaerythritol triacrylate, pentaerythritol tetracrylate, dipentaerythritol hexacrylate, 1,9-nonanediol di(meth)acrylate, Light Ester P-2M (manufactured by Kyoeisha Chemical), triacrylate of an adduct of 3 moles of ethylene oxide to pentaerythritol, oligopropylene glycol di(meth)acrylate and polytetramethylene glycol di(meth)acrylate Cross-linking agents of an alkylene glycol type and an alkylene ether type are particularly preferred.

In order to enhance the mechanical strength of the printing plate and to improve the printing durability, the photopolymerizable monomer containing no hydroxyl group (C-3) preferably comprises, besides the above-mentioned ones, at least one kind of alkyl methacrylate and, particularly preferably, it comprises a $C_{8-18}$ and straightly linear alkyl methacrylate. Specific examples thereof include alkyl (meth)acrylate such as methyl (meth)acrylate, ethyl (meth) acrylate, propyl (meth)acrylate, butyl (meth)acrylate, isoamyl (meth)acrylate, 2-ethylhexyl (meth)acrylate, lauryl (meth)acrylate or stearyl (meth)acrylate; cycloalkyl (meth) acrylate such as cyclohexyl (meth)acrylate; halogenated alkyl (meth)acrylate such as chloroethyl (meth)acrylate or chloropropyl (meth)acrylate; alkoxyalkyl (meth)acrylate such as methoxyethyl (meth)acrylate, ethoxyethyl (meth) acrylate or butoxyethyl (meth)acrylate; and phenoxyalkyl (meth)acrylate such as phenoxyethyl (meth)acrylate or nonylphenoxyethyl (meth)acrylate. Particularly preferred examples include n-lauryl methacrylate, alkyl ($C_{12-13}$) methacrylate, tridecyl methacrylate and alkyl ($C_{12-15}$) methacrylate. Compounding amount of the component (C-3) in the photosensitive resin composition is preferred to be 0 to 20% by mass. When it exceeds 20% by mass, tackiness of the resin increases and handling may become bad.

The photopolymerization initiator (D) can be any compound as far as it is capable of causing a polymerizable carbon-carbon unsaturated group to polymerize by light irradiation. Among them, a compound which has a function of generating a radical through self decomposition or hydrogen extraction caused by light absorption is used preferably. Specific examples thereof include benzoin alkyl ethers, benzophenones, anthraquinones, benzyls, acetophenones, diacetyls and the like. Compounding amount of the component (D) in the photosensitive resin composition is preferred to be 0.1 to 10% by mass and more preferred to be 0.2 to 5% by mass. When the component (D) is less than the above range, the above polymerization effect may not be fully achieved. When it exceeds the above range, transparency of the resin is deteriorated and no sharp relief may be obtained.

The rubber (E) is used for imparting rubber elasticity to the photosensitive resin composition. Specific examples of the component (E) include butadiene rubber (BR), nitrile rubber (NBR), acrylic rubber, epichlorohydrin rubber, urethane rubber, isoprene rubber, styrene isoprene rubber, styrene butadiene rubber, ethylene-propylene copolymer and chlorinated polyethylene. Each of them may be used solely or two or more of them may be used jointly. Among them, butadiene rubber (BR) and nitrile rubber (NBR) are preferred, and butadiene rubber (BR) is the most preferred. It is also preferred that each of a hydrophobic polymer obtained from a water-dispersed latex of the above component (A) and the rubber of the component (E) has a common skeleton structure. As a result thereof, mechanical strength of the photosensitive resin composition is enhanced and a printing plate exhibiting the printing durability can be obtained. Compounding amount of the component (E) in the photosensitive resin composition is preferred to be 0.5 to 15% by mass, more preferred to be 1 to 10% by mass, and further preferred to be 1 to 7% by mass. When the component (E) is less than the above range, toughness of a relief may be deteriorated. When it exceeds the above range, problem such as that water developing process becomes time-consuming may happen.

Compounding ratio of the component (A) to the component (E) in the photosensitive resin composition is preferred to be within a range of 0.5 to 35% in terms of the ratio of the mass of the component (E) to the total mass of the components (A) and (E) (ratio by mass of E/(A+E)). It is more preferred to be within a range of 3 to 25%, and further preferred to be within a range of 5 to 20%. When the ratio by mass is less than the above range, mechanical strength/elongation lowers. When it exceeds the above range, there are problems such as that reproducibility of fine image lowers or water developing process becomes time-consuming.

In the photosensitive resin composition of the present invention, it is possible to appropriately add other components such as aggregation preventer, plasticizer, polymerization inhibitor, ultraviolet absorber, dye, pigment, defoaming agent and fragrance for a purpose of improving various characteristics within such an extent that the effects of the present invention are not disturbed thereby.

The photosensitive resin composition of the present invention is used in a photosensitive resin layer of a CTP flexographic printing original plate. The CTP flexographic printing original plate of the present invention consists of at least a support, a photosensitive resin layer, a protective layer and a heat-sensitive mask layer.

The support to be used for the original plate of the present invention is preferably made from a material being flexible and having a superior dimension stability, and examples thereof include: a support made of metal, such as steel, aluminum, copper and nickel, and a support made of a thermoplastic resin, such as a polyethylene terephthalate film, a polyethylene naphthalate film, a polybutylene terephthalate film and a polycarbonate film. Among these, the polyethylene terephthalate film, which has a superior dimension stability and a sufficiently high viscoelasticity, is in particular preferably used. The thickness of the support is set to 50 to 350 µm, preferably, to 100 to 250 µm, from the viewpoints of mechanical properties, shape stability and handling characteristics upon producing a printing plate. Moreover, if necessary, an adhesive may be formed between them in order to improve an adhesive property between the support and a photosensitive resin layer.

The protective layer used for the original plate of the present invention is formed in order to prevent the mass transfer between a photosensitive resin layer and a heat-sensitive mask layer and also to prevent the polymerization inhibition due to oxygen in the photosensitive resin layer. The protective layer is not particularly limited but may be constituted even by the use of any polymer being soluble or insoluble in water. Examples of the polymer which constitutes the protective layer include soluble polyamide, polyvinyl alcohol, polyacrylic acid, polyethylene oxide, alkyl cellulose, cellulose polymer (particularly, hydroxypropyl cellulose, hydroxyethyl cellulose and nitrocellulose), cellulose acetate butyrate, polybutyral, butyl rubber, NBR rubber, acrylic rubber, styrene-butadiene rubber, latex and soluble polyester. Each of those polymers is not limited to the use of a single one but two or more polymers may be combined and used. As to the protective layer, that which has a higher thermal decomposition temperature than that of a heat-sensitive mask layer is preferred. That is because, when thermal decomposition temperature of a protective layer is lower than that of a heat-sensitive mask layer, the protective layer may be also thermally decomposed upon ablation of the heat-sensitive mask layer.

With regard to layer thickness of a protective layer, it is preferred to be 0.2 µm to 3.0 µm and more preferred to be 0.2 µm to 1.5 µm. When it is less than the above lower limit, oxygen barrier property becomes insufficient and roughness may be resulted on a plate surface of a relief. When it exceeds the above upper limit, poor reproduction of fine lines may happen.

The heat-sensitive mask layer to be used for the original plate of the present invention is composed of carbon black (which is a material having a function for absorbing infrared laser rays to convert them into heat and a function for blocking ultraviolet rays) and a dispersion binder therefor. Moreover, desired components except for these, such as a pigment dispersant, a filler, a surfactant or a painting aid, may be contained therein within such a range as not to impair the effects of the present invention.

The heat-sensitive mask layer is preferably designed to have an optical density of 2.0 or more, more preferably, an optical density of 2.0 to 3.0, and most preferably, an optical density of 2.2 to 2.5, relative to chemical rays.

The layer thickness of the heat-sensitive mask layer is preferably set to 0.5 to 2.5 µm, more preferably, to 1.0 to 2.0 µm. When the layer thickness is set to the above-mentioned lower limit or more, it is possible to obtain an optical density of not less than a predetermined value, without the necessity of a sophisticated coating technique. Moreover, when the layer thickness is set to the above-mentioned upper limit or less, high energy is not required for evaporation of the heat-sensitive mask layer, which is advantageous from the viewpoint of costs.

It is preferable to provide a peelable flexible cover film on the heat-sensitive mask layer to protect the printing original plate. Examples of the preferable peelable flexible cover film include a polyethylene terephthalate film, a polyethylene naphthalate film and a polybutylene terephthalate film. However, such a protective film is not absolutely necessary.

Now, a method for manufacturing a printing plate from the printing original plate of the present invention will be explained. When the cover film is present, the cover film is firstly removed from the photosensitive printing original plate. Thereafter, the heat-sensitive mask layer is image-wise-irradiated with an IR laser so that a mask is formed on the photosensitive resin layer. Preferable examples of the IR laser include an ND/YAG laser (1064 nm) and a diode laser (for example, 830 nm). A laser system appropriate for the Computer to Plate Technique is commercially available, and, for example, CDI SpArk (manufactured by Esko-Graphics Co., Ltd.) may be used. This laser system includes a rotation cylinder drum used for holding a printing original plate, an IR laser irradiating device and a layout computer. Image information is directly transferred from the layout computer to the laser device.

After the image information has been written in the heat-sensitive mask layer, active light rays are applied onto the entire surface of the photosensitive printing original plate. This process may be carried out with the plate attached to the laser cylinder; however, a method is generally used in which, after the plate has been removed from the laser device, the irradiation process is carried out by using a commonly-used irradiation unit having a flat plate shape because this method is more advantageous in that even a plate size out of the standard can be appropriately handled. Examples of the active light rays include: ultraviolet rays having a wavelength in a range from 150 to 500 nm, in particular, from 300 to 400 nm. Examples of its light source include: a low-pressure mercury lamp, a high-pressure mercury lamp, a super-high pressure mercury lamp, a metal halide lamp, a xenon lamp, a zirconium lamp, a carbon arc lamp and an ultraviolet-ray fluorescent lamp. Thereafter, the irradiated plate is developed so that a printing plate is obtained. The developing process can be carried out by using a commonly-used developing unit.

EXAMPLES

The present invention will now be specifically illustrated by way of the following Examples although the present invention is not limited thereto.

<Preparation of Photosensitive Resin Original Plate>

A polyester adhesive in the thickness of 10 µm was coated on a polyethylene terephthalate film of 250 µm thickness so as to prepare a support. A protective layer (polyvinyl alcohol) and a heat-sensitive mask layer (a dispersion of carbon black in butyral resin) were coated on a polyethylene terephthalate film of 125 µm thickness so as to prepare a cover film. After that, the photosensitive resin composition prepared in each of Examples and Comparative Examples was sandwiched between the above-mentioned support and cover film in such a manner that the adhesive layer and the protective layer contact the photosensitive resin composition and was then heated/compressed for 1 minute at 100° C. and at 15 MPa pressure using a heat press machine so as to prepare a photosensitive resin original plate having a thickness of the photosensitive resin layer of 1.0 mm.

<Preparation of Relief for Evaluation>

The photosensitive resin original plate was subjected to a back exposure to light using a fluorescent lamp for ultraviolet ray having illuminance at 350 nm of 8.0 w/m$^2$ (10R, manufactured by Philips). Then the cover film was released. Then an image containing fine lines of at least 300 µm line width was subjected to ablation to the heat-sensitive mask layer of a resin plate using an IR laser irradiator. After that, main exposure to light was carried out using the same fluorescent lamp for ultraviolet ray and then developing was conducted for 7 minutes using a developing device. As to the developer, a neutral water of 40° C. containing 4% by mass of sodium alkyl naphthalenesulfonate was used. Then water was removed from the developed plate, drying was conducted at 60° C. for 10 minutes, post-exposure to light was done for 5 minutes using the same fluorescent lamp for ultraviolet ray and, after that, irradiation using a germicidal lamp was conducted for 5 minutes to carry out a surface treatment whereupon a relief for evaluation was prepared.

Evaluation for each of properties was carried out according to the following measuring method:

<Cupping Evaluation>

The relief for evaluation prepared by the above method was fixed to a board made of metal using a magnet and then 3D pictures of 300-μm fine lines thereof were taken using an ultra-deep color 3D profile measuring microscope (VK-9500) manufactured by Keyence. Distance from the lowest area to the highest area of the top part of 300-μm fine lines was taken as a cupping value. The cupping value is better when the resulting figure is lower.

<Evaluation of Releasing Property of Cover Film>

Releasing property of cover film as evaluated after the photosensitive resin original plate prepared by the above method was allowed to stand for 24 hours under the condition of being shielded from light. When the cover film could be released, that was marked "○" while, when it could not be released, that was marked "x".

<Evaluation of Resistance of a Heat-Sensitive Mask Layer (Coat Layer)>

Evaluation of the resistance of a heat-sensitive mask layer (coat layer) to a photopolymerizable unsaturated compound (C) was carried out as follows: Thus, a protective layer (polyvinyl alcohol) and a heat-sensitive mask layer (a dispersion of carbon black in butyral resin) were coated on a polyethylene terephthalate film of 125 μm thickness so as to prepare a cover film. Onto the coated surface of the cover film, a gauze impregnated with a photopolymerizable unsaturated compound (C) was adhered. After 10 minutes, the gauze impregnated with a photopolymerizable unsaturated compound (C) was detached, the coated surface was rubbed with a new gauze and the case wherein the coat was detached at that time was marked "x". After 24 hours, a gauze impregnated with a photopolymerizable unsaturated compound (C) was detached, the coated surface was rubbed with a new gauze and the case wherein the coat was detached at that time was marked "Δ". Incidentally, the case which corresponded to both x and Δ was marked "x" while the case which corresponded to neither x nor Δ was marked "○".

<Mechanical Strength/Elongation of Photosensitive Resin Composition>

A photosensitive resin composition subjected to heat pressing to an extent of 1 mm thickness was photo-cured and taken out using a metal mold. Elongation and strength thereof were measured by a tensile test using Tensilon (using 100 kg of cross-head) at a test speed of 200 m/minute. The measured elongation and strength were multiplied together and the product was adopted as the mechanical strength/elongation (kg %/mm$^2$).

<Developing Property>

When the differences (relief depth) between the heights at the areas irradiated with and without light of the relief for evaluation prepared by the above method were less than 0.2 mm, from 0.2 mm to less than 0.4 mm and 0.4 mm or more, they were marked "x", "Δ" and "○", respectively.

Example 1A

Butadiene latex (Nippol LX111NF, manufactured by Nippon Zeon) (45 parts by mass (solid basis)) and 10 parts by mass (solid basis) of acrylonitrile-butadiene latex (Nippol SX1503, manufactured by Nippon Zeon) which were the component (A); 12 parts by mass (solid basis) of hydrophilic polymer (PFT-3 manufactured by Kyoeisha Chemical) which was the component (B); 12 parts by mass of oligobutadiene acrylate (ABU-4 manufactured by Kyoeisha Chemical) as the component (C-1), 7.5 parts by mass of glycerol monomethacrylate (G101P manufactured by Kyoeisha Chemical) as the component (C-2) and 7.5 parts by mass of lauryl methacrylate as the component (C-3) which were the component (C); 0.7 part by mass of a photopolymerization initiator which was the component (D); 0.03 part by mass of hydroquinone monomethyl ether as a polymerization inhibitor; and 0.04 part by mass of a carboxylate-type copolymer as other additive were mixed in a container together with 15 parts by mass of toluene and then toluene and water were removed therefrom in vacuo together with kneading at 80° C. using a kneader. A resin original plate was prepared using the resulting photosensitive resin composition in accordance with the above-mentioned method for the manufacture of a photosensitive resin plate. The resulting original plate was evaluated for cupping, releasability of cover film and resistance of heat-sensitive mask layer (coat layer) according to the above-mentioned methods. Details of the photosensitive resin composition (only for the component (C)) and result of the evaluation are shown in Table 1.

Examples 2A to 6A and Comparative Examples 1A to 6A

With regard to Examples 2A to 6A and Comparative Examples 1A to 6A, photosensitive resin compositions and resin original plates were prepared and evaluated in the same manner as in Example 1A except that only components (C-2) and (C-3) were modified as shown in Table 1. Details of the photosensitive resin composition (only for the component (C)) and result of the evaluation are shown in Table 1.

TABLE 1

| | | Product name | Example 1A | Example 2A | Example 3A | Example 4A | Example 5A | Example 6A |
|---|---|---|---|---|---|---|---|---|
| Photopolymerizable monomer | C-1 | oligobutadiene acrylate | 12 | 12 | 12 | 12 | 12 | 12 |
| | C-2 | GLM (manufactured by NOF CORPORATION) glycerol skeleton (molecular weight 148) | | | | | | |
| | | CHKK (manufactured by Kyoeisha Chemical) glycerol skeleton (molecular weight 546) | | 7.5 | | | | |
| | | CL (manufactured by Kyoeisha Chemical) CL modified glycerol skelton (molecular weight 179) | | | | | | |

TABLE 1-continued

|  |  | Product name | | | | | | |
|---|---|---|---|---|---|---|---|---|
|  |  | G101P (manufactured by Kyoeisha Chemical) glycerol skeleton (molecular weight 228) | 7.5 |  |  |  |  |  |
|  |  | EA-5323 (manufactured by Shin Nakamura Chemical Co., Ltd.) pentaerythritol skeleton (molecular weight 636) |  | 7.5 | 15 |  |  |  |
|  |  | A-TMM-3L (manufactured by Shin Nakamura Chemical Co., Ltd.) pentaerythritol skeleton (molecular weight 316) |  |  |  | 7.5 |  |  |
|  |  | A-9570W (manufactured by Shin Nakamura Chemical Co., Ltd.) dipentaerythritol skeleton (molecular weight 531) |  |  |  |  |  | 7.5 |
|  | C-3 | lauryl methacrylate | 7.5 |  | 7.5 | 7.5 | 7.5 | 7.5 |
|  |  | trimethylolpropane tri(meth)acrylate |  | 7.5 |  |  |  |  |
|  |  | Hydroxyl group concentration (equivalent mol/kg) | 0.30 | 0.40 | 0.50 | 1.00 | 0.16 | 0.12 |
|  |  | Cupping (μm) | 2 | 1 | 0 | 0 | 1 | 2 |
|  |  | Release of a cover film | ○ | ○ | ○ | ○ | ○ | ○ |
|  |  | Resistance of a heat-sensitive mask layer (coat layer) | Δ | ○ | ○ | ○ | ○ | ○ |

|  |  | Product name | Comparative Example 1A | Comparative Example 2A | Comparative Example 3A | Comparative Example 4A | Comparative Example 5A | Comparative Example 6A |
|---|---|---|---|---|---|---|---|---|
| Photopolymerizable monomer | C-1 | oligobutadiene acrylate | 12 | 12 | 12 | 12 | 12 | 12 |
|  | C-2 | GLM (manufactured by NOF CORPORATION) glycerol skeleton (molecular weight 148) |  |  |  | 1.5 | 7.5 |  |
|  |  | CHKK (manufactured by Kyoeisha Chemical) glycerol skeleton (molecular weight 546) |  |  |  |  |  |  |
|  |  | CL (manufactured by Kyoeisha Chemical) CL modified glycerol skelton (molecular weight 179) |  |  |  |  |  | 7.5 |
|  |  | G101P (manufactured by Kyoeisha Chemical) glycerol skeleton (molecular weight 228) |  |  |  |  |  |  |
|  |  | EA-5323 (manufactured by Shin Nakamura Chemical Co., Ltd.) pentaerythritol skeleton (molecular weight 636) |  |  |  |  |  |  |
|  |  | A-TMM-3L (manufactured by Shin Nakamura Chemical Co., Ltd.) pentaerythritol skeleton (molecular weight 316) |  |  |  |  |  |  |
|  |  | A-9570W (manufactured by Shin Nakamura Chemical Co., Ltd.) dipentaerythritol skeleton (molecular weight 531) |  |  |  |  |  |  |
|  | C-3 | lauryl methacrylate | 7.5 | 15 |  | 6 |  | 7.5 |
|  |  | trimethylolpropane tri(meth)acrylate | 7.5 |  | 15 | 7.5 | 7.5 |  |
|  |  | Hydroxyl group concentration (equivalent mol/kg) | 0.00 | 0.00 | 0.00 | 0.20 | 1.00 | 0.40 |
|  |  | Cupping (μm) | 7 | 6 | 5 | 3 | 0 | 2 |
|  |  | Release of a cover film | ○ | ○ | ○ | ○ | × | × |
|  |  | Resistance of a heat-sensitive mask layer (coat layer) | ○ | ○ | ○ | Δ | × | × |

As will be apparent from the result of Table 1, the products using the photosensitive resin compositions of Examples 1A to 6A exhibited excellent and well-balanced cupping, releasing property of cover film and resistance of heat-sensitive mask layer (coat layer).

Example 1B

Polybutadiene latex (Nippol LX111NF, manufactured by Nippon Zeon) (42 parts by mass (solid basis)) and 8 parts by mass (solid basis) of acrylonitrile-butadiene copolymer latex (Nippol SX1503, manufactured by Nippon Zeon) which were the component (A), 5 parts by mass (solid basis) of BR rubber (Nippol BR1220, manufactured by Nippon Zeon) which was the component (E) and 80 parts by mass of toluene were heated at 60° C. to prepare a liquid in which rubber was dissolved. This was allowed to cool down to room temperature. To this, 8 parts by mass (solid basis) of hydrophilic polymer (PFT-4 manufactured by Kyoeisha Chemical) which was the component (B), 20 parts by mass of oligobutadiene acrylate (ABU-4 manufactured by Kyoeisha Chemical) which was the component (C-1), 5 parts by mass of glycerol dimethacrylate (G101P manufactured by Kyoeisha Chemical) which was the component (C-2), 5 parts by mass of lauryl methacrylate and 5 parts by mass of trimethylolpropane methacrylate which were the component (C-3), 1 part by mass of photopolymerization initiator (Irgacure 651) which was the component (D), 0.05 part by mass of hydroquinone monomethyl ether as a polymerization inhibitor and 0.05 part by mass of carboxylate-type copolymer as other additive were added and mixed in a container together with 15 parts by mass of toluene and then toluene and water were evaporated therefrom in vacuo together with kneading at 80° C. using a kneader. A resin original plate was prepared using the resulting photosensitive resin composition in accordance with the above-mentioned method for the manufacture of a photosensitive resin original plate. The resulting original plate was evaluated for all of the above evaluation properties. Details of the photosensitive resin composition (only for the components (A) to (E)) and result of the evaluation are shown in Table 2.

Examples 2B to 11B and Comparative Examples 1B to 10B

With regard to Examples 2B to 11B and Comparative Examples 1B to 10B, photosensitive resin compositions and resin original plates were prepared and evaluated in the same manner as in Example 1B except that only components (A), (E), (C-2), and (C-3) were modified as shown in Tables 2 and 3. Details of the photosensitive resin composition (only for the components (A) to (E)) and result of the evaluation are shown in Tables 2 and 3.

TABLE 2

|  |  |  |  | Example 1B | Example 2B | Example 3B | Example 4B | Example 5B | Example 6B |
|---|---|---|---|---|---|---|---|---|---|
| Water-dispersible latex | A | BR latex | | 42 | 42 | 45 | 45 | 44 | 44 |
| | | NBR latex | | 8 | 8 | 9 | 9 | 8 | 8 |
| Rubber | E | BR rubber | | 5 | 5 | | | 3 | 3 |
| | | NBR rubber | | | | 2 | 2 | | |
| Hydrophilic polymer | B | PFT-4 (manufactured by Kyoeisha Chemical) | | 8 | 8 | 8 | 8 | 8 | 8 |
| Photopolymerizable monomer | C-1 | oligobutadiene acrylate | | 20 | 20 | 20 | 20 | 20 | 20 |
| | C-2 | GLM (manufactured by NOF CORPORATION) glycerol skeleton (molecular weight 148) | | | | | | | |
| | | G101P (manufactured by Kyoeisha Chemical) glycerol skeleton (molecular weight 228) | | 5 | 10 | 2 | 5 | | |
| | | EA-5323 (manufactured by Shin Nakamura Chemical Co., Ltd.) pentaerythritol skeleton (molecular weight 636) | | | | | | 8 | 13 |
| | | A-9570W (manufactured by Shin Nakamura Chemical Co., Ltd.) dipentaerythritol skeleton (molecular weight 531) | | | | | | | |
| | C-3 | lauryl methacrylate | | 5 | 2.5 | 6 | 4.5 | 3.5 | 1 |
| | | trimethylolpropane tri(meth)acrylate | | 5 | 2.5 | 6 | 4.5 | 3.5 | 1 |
| Photopolymerization initiator | D | Irgacure 651 | | 1 | 1 | 1 | 1 | 1 | 1 |
| Hydroxyl group concentration (equivalent mol/kg) | | | | 0.2 | 0.4 | 0.1 | 0.2 | 0.5 | 1.0 |
| Cupping (μm) | | | | 2 | 1 | 3 | 2 | 0 | 0 |
| Release of a cover film | | | | ○ | ○ | ○ | ○ | ○ | ○ |
| Resistance of a heat-sensitive mask layer (coat layer) | | | | ○ | ○ | ○ | ○ | ○ | ○ |
| Mechanical strength/elongation (kg %/mm$^2$) | | | | 220 | 210 | 190 | 180 | 180 | 120 |
| Developing property | | | | ○ | ○ | ○ | ○ | ○ | ○ |

|  |  |  | Example 7B | Example 8B | Example 9B | Example 10B | Example 11B |
|---|---|---|---|---|---|---|---|
| Water-dispersible latex | A | BR latex | 45 | 44 | 44 | 37 | 44 |
| | | NBR latex | 9 | 8 | 8 | 6 | 8 |
| Rubber | E | BR rubber | 1 | 3 | 3 | 13 | |
| | | NBR rubber | | | | | 3 |
| Hydrophilic polymer | B | PFT-4 (manufactured by Kyoeisha Chemical) | 8 | 8 | 8 | 8 | 8 |
| Photopolymerizable monomer | C-1 | oligobutadiene acrylate | 20 | 20 | 20 | 20 | 20 |
| | C-2 | GLM (manufactured by NOF CORPORATION) glycerol skeleton (molecular weight 148) | | | | | |
| | | G101P (manufactured by Kyoeisha Chemical) glycerol skeleton (molecular weight 228) | | | | | |
| | | EA-5323 (manufactured by Shin Nakamura Chemical Co., Ltd.) pentaerythritol skeleton (molecular weight 636) | | | | | |
| | | A-9570W (manufactured by Shin Nakamura Chemical Co., Ltd.) dipentaerythritol skeleton (molecular weight 531) | 5 | 5 | 15 | 5 | 5 |
| | C-3 | lauryl methacrylate | 5 | 5 | | 4.5 | 5 |
| | | trimethylolpropane tri(meth)acrylate | 5 | 5 | | 4.5 | 5 |
| Photopolymerization initiator | D | Irgacure 651 | 1 | 1 | 1 | 1 | 1 |
| Hydroxyl group concentration (equivalent mol/kg) | | | 0.1 | 0.1 | 0.2 | 0.1 | 0.1 |
| Cupping (μm) | | | 2 | 2 | 1 | 2 | 2 |
| Release of a cover film | | | ○ | ○ | ○ | ○ | ○ |
| Resistance of a heat-sensitive mask layer (coat layer) | | | ○ | ○ | ○ | ○ | ○ |
| Mechanical strength/elongation (kg %/mm$^2$) | | | 120 | 140 | 100 | 200 | 150 |
| Developing property | | | ○ | ○ | ○ | Δ | ○ |

TABLE 3

|  |  |  | Comparative Example 1B | Comparative Example 2B | Comparative Example 3B | Comparative Example 4B | Comparative Example 5B |
|---|---|---|---|---|---|---|---|
| Water-dispersible latex | A | BR latex | 44 | 44 | 46 | 46 | 46 |
| | | NBR latex | 8 | 8 | 9 | 9 | 9 |
| Rubber | E | BR rubber | 3 | 3 | | | |
| | | NBR rubber | | | | | |

TABLE 3-continued

| | | | | | | | |
|---|---|---|---|---|---|---|---|
| Hydrophilic polymer | B | PFT-4 (manufactured by Kyoeisha Chemical) | 8 | 8 | 8 | 8 | 8 |
| Photopolymerizable monomer | C-1 | oligobutadiene acrylate | 20 | 20 | 20 | 20 | 20 |
| | C-2 | GLM (manufactured by NOF CORPORATION) glycerol skeleton (molecular weight 148) | 1 | 8 | 8 | | |
| | | G101P (manufactured by Kyoeisha Chemical) glycerol skeleton (molecular weight 228) | | | | | |
| | | EA-5323 (manufactured by Shin Nakamura Chemical Co., Ltd.) pentaerythritol skeleton (molecular weight 636) | | | | | |
| | | A-9570W (manufactured by Shin Nakamura Chemical Co., Ltd.) dipentaerythritol skeleton (molecular weight 531) | | | | 15 | |
| | C-3 | lauryl methacrylate | 7 | 3.5 | 3.5 | | 7.5 |
| | | trimethylolpropane tri(meth)acrylate | 7 | 3.5 | 3.5 | | 7.5 |
| Photopolymerization initiator | D | Irgacure 651 | 1 | 1 | 1 | 1 | 1 |
| Hydroxyl group concentration (equivalent mol/kg) | | | 0.1 | 1.0 | 1.0 | 0.2 | 0.0 |
| Cupping (μm) | | | 3 | 0 | 0 | 1 | 7 |
| Release of a cover film | | | o | x | x | o | o |
| Resistance of a heat-sensitive mask layer (coat layer) | | | x | x | x | o | o |
| Mechanical strength/elongation (kg %/mm$^2$) | | | 180 | 150 | 110 | 60 | 130 |
| Developing property | | | o | o | o | o | o |

| | | | Comparative Example 6B | Comparative Example 7B | Comparative Example 8B | Comparative Example 9B | Comparative Example 10B |
|---|---|---|---|---|---|---|---|
| Water-dispersible latex | A | BR latex | 46 | 38 | 42 | 42 | 34 |
| | | NBR latex | 9 | 7 | 8 | 8 | 6 |
| Rubber | E | BR rubber | | 3 | 5 | | 20 |
| | | NBR rubber | | | | 5 | |
| Hydrophilic polymer | B | PFT-4 (manufactured by Kyoeisha Chemical) | 8 | 8 | 8 | 8 | 8 |
| Photopolymerizable monomer | C-1 | oligobutadiene acrylate | 20 | 20 | 20 | 20 | 20 |
| | C-2 | GLM (manufactured by NOF CORPORATION) glycerol skeleton (molecular weight 148) | | | | | |
| | | G101P (manufactured by Kyoeisha Chemical) glycerol skeleton (molecular weight 228) | | | | | |
| | | EA-5323 (manufactured by Shin Nakamura Chemical Co., Ltd.) pentaerythritol skeleton (molecular weight 636) | | | | | |
| | | A-9570W (manufactured by Shin Nakamura Chemical Co., Ltd.) dipentaerythritol skeleton (molecular weight 531) | | 22 | | | 4 |
| | C-3 | lauryl methacrylate | | | 7.5 | 7.5 | 3 |
| | | trimethylolpropane tri(meth)acrylate | 15 | 7.5 | 7.5 | 7.5 | 3 |
| Photopolymerization initiator | D | Irgacure 651 | 1 | 1 | 1 | 1 | 1 |
| Hydroxyl group concentration (equivalent mol/kg) | | | 0.0 | 0.5 | 0.0 | 0.0 | 0.1 |
| Cupping (μm) | | | 6 | 0 | 7 | 7 | — |
| Release of a cover film | | | o | o | o | o | o |
| Resistance of a heat-sensitive mask layer (coat layer) | | | o | o | o | o | o |
| Mechanical strength/elongation (kg %/mm$^2$) | | | 60 | 50 | 200 | 180 | 110 |
| Developing property | | | o | o | o | o | x |

As will be apparent from the result of Tables 2 and 3, the products using the photosensitive resin compositions of Examples 1B to 11B exhibited excellent and well-balanced cupping, releasing property of cover film, resistance of heat-sensitive mask layer (coat layer), mechanical strength/elongation, and developing property.

INDUSTRIAL APPLICABILITY

The flexographic printing original plate using the photosensitive resin composition of the present invention is excellent in its image reproducibility and developing property, generates no printing blur due to making the bulging of relief edge area minimum and satisfies the printing durability whereby it can be effectively utilized as a CTP photosensitive flexographic printing original plate.

The invention claimed is:

1. A photosensitive resin composition for CTP flexographic printing original plate containing
at least a hydrophobic polymer obtained from water-dispersible latex (A),
a hydrophilic polymer (B),
a photopolymerizable unsaturated compound (C)
a photopolymerization initiator (D), and
a rubber (E) for imparting rubber elasticity to the photosensitive resin composition, wherein the content of the rubber (E) is 1 to 7% by mass of the photosensitive resin composition,
characterized in that, the photopolymerizable unsaturated compound (C) comprises a photopolymerizable oligomer containing no hydroxyl group (C-1), a hydroxyl group-containing photopolymerizable monomer having a weight-average molecular weight of 200 to 1500 and having a pentaerythritol skeleton, a dipentaerythritol skeleton or a glycerol skeleton (C-2) and, a photopolymerizable monomer containing no hydroxyl group (C-3), wherein the content of the hydroxyl group-containing photopolymerizable monomer (C-2) is 1 to 20% by mass of the photosensitive resin composition.

2. The photosensitive resin composition for CTP flexographic printing original plate according to claim 1, wherein concentration of the hydroxyl groups derived from the hydroxyl group-containing photopolymerizable monomer (C-2) is 0.1 to 1.5 equivalent mol/kg.

3. The photosensitive resin composition for CTP flexographic printing original plate according to claim 1, wherein concentration of the hydroxyl groups derived from the hydroxyl group-containing photopolymerizable monomer (C-2) is 0.1 to 1.5 equivalent mol/kg.

4. A CTP flexographic printing original plate, characterized in that, a heat-sensitive mask layer is formed on a surface of a photosensitive resin layer comprising the photosensitive resin composition mentioned in claim 1.

5. A CTP flexographic printing original plate, characterized in that, a heat-sensitive mask layer is formed on a surface of a photosensitive resin layer comprising the photosensitive resin composition mentioned in claim 2.

6. A CTP flexographic printing original plate, characterized in that, a heat-sensitive mask layer is formed on a surface of a photosensitive resin layer comprising the photosensitive resin composition mentioned in claim 3.

7. A CTP flexographic printing original plate comprising the photosensitive resin composition according to claim 1, and a support.

8. A CTP flexographic printing original plate according to claim 7, wherein the support is formed of steel, aluminum, copper or nickel.

9. A CTP flexographic printing original plate according to claim 7, wherein the support is formed of polyethylene terephthalate film, a polyethylene naphthalate film, a polybutylene terephthalate film or a polycarbonate film.

10. A CTP flexographic printing original plate according to claim 7, wherein a heat-sensitive mask layer is formed on a surface of the photosensitive resin.

11. A CTP flexographic printing original plate according to claim 10, wherein the CTP flexographic printing original plate further comprises a protective layer formed between the photosensitive resin layer and the heat-sensitive mask layer.

12. A CTP flexographic printing original plate according to claim 11, wherein the protective layer is formed from a polymer selected from the group consisting of polyamide, polyvinyl alcohol, polyacrylic acid, polyethylene oxide, alkyl cellulose, hydroxypropyl cellulose, hydroxyethyl cellulose, nitrocellulose, cellulose acetate butyrate, polybutyral, butyl rubber, NBR rubber, acrylic rubber, styrene-butadiene rubber, latex or soluble polyester.

* * * * *